310-322 SR
8/5/86 XR 4,604,606

United States Patent [19]

Sweany

[11] Patent Number: 4,604,606

[45] Date of Patent: Aug. 5, 1986

[54] AUDIO SIGNALLING DEVICE

[75] Inventor: Louis P. Sweany, Carmel, Ind.

[73] Assignee: Emhart Industries, Inc., Indianapolis, Ind.

[21] Appl. No.: 763,775

[22] Filed: Aug. 8, 1985

Related U.S. Application Data

[63] Continuation of Ser. No. 430,869, Sep. 30, 1982, abandoned.

[51] Int. Cl.[4] .......................... G08B 3/00; H01L 41/04

[52] U.S. Cl. ............................ 340/384 E; 340/384 R; 310/322; 310/324

[58] Field of Search ............... 340/384 E, 384 R, 391; 310/322, 324, 321

[56] References Cited

U.S. PATENT DOCUMENTS 4,139,842 2/1979 Fujita et al. .................... 340/384 E
4,233,679 11/1980 Schwarzschild ........... 340/384 E X
4,282,520 8/1981 Shipp et al. ......................... 310/322
4,295,009 10/1981 Weidler ........................... 310/324 X
4,420,706 12/1983 Siebold et al. .................. 310/322 X

*Primary Examiner*—John W. Caldwell, Sr.
*Assistant Examiner*—Tyrone Queen
*Attorney, Agent, or Firm*—Carl A. Forest; Robert F. Meyer

[57] ABSTRACT

An audio signalling device provides a housing having at least one end, a piezoelectric transducer, a nodal mounting for the piezoelectric transducer in proximity to the end of the housing, a planar member, a mounting for the planar member in a spaced adjacent relationship with the piezoelectric transducer, and spring contacts mounted on the planar member for making spring biased electrical contact with the piezoelectric transducer.

6 Claims, 4 Drawing Figures

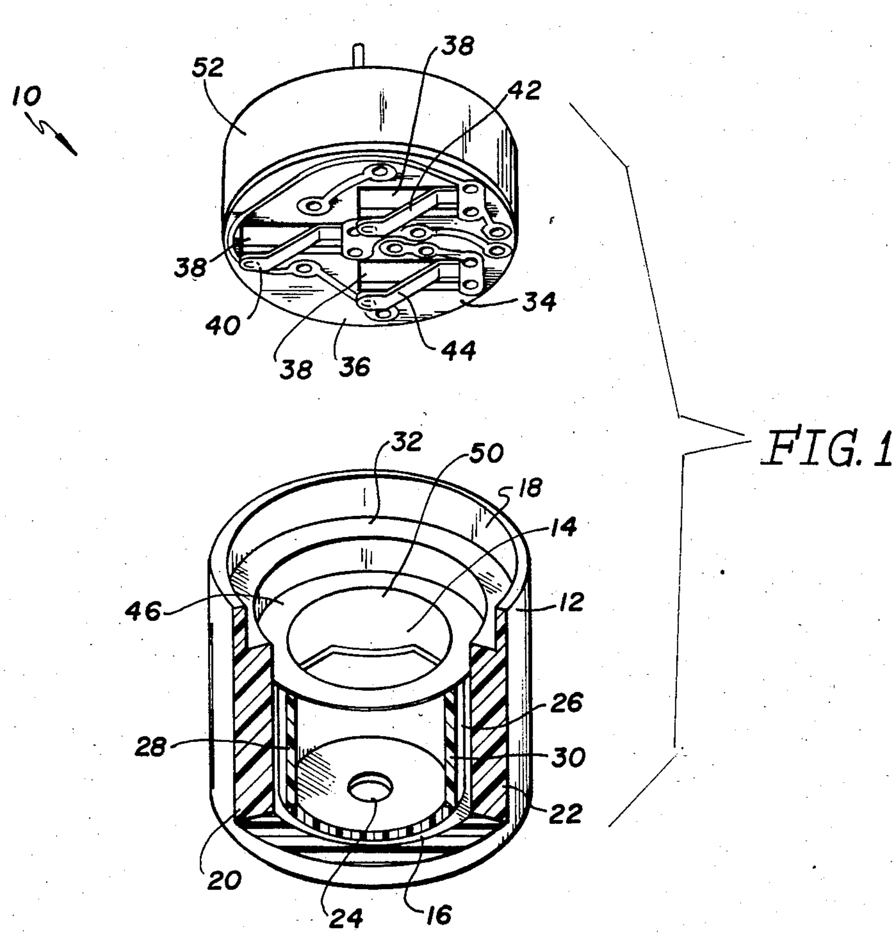
FIG. 1
FIG. 2
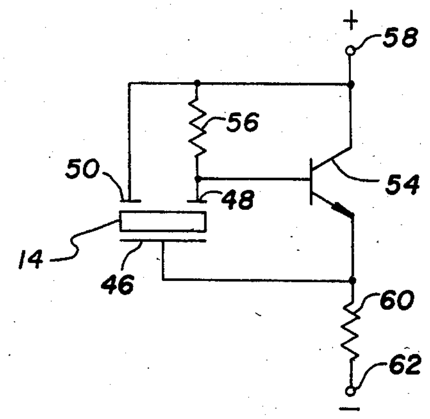

FIG. 3
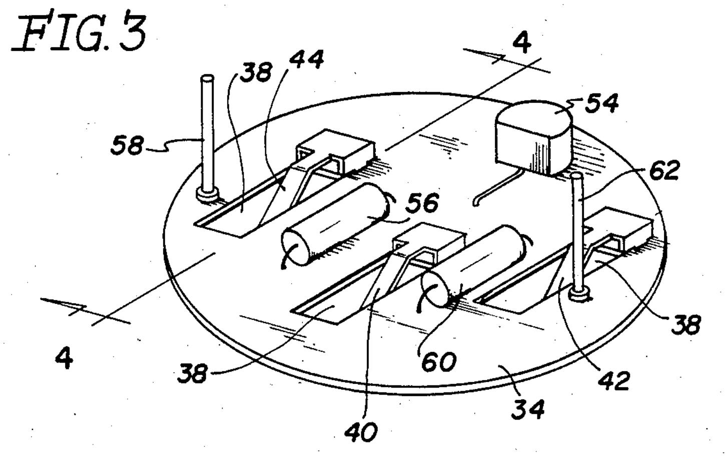
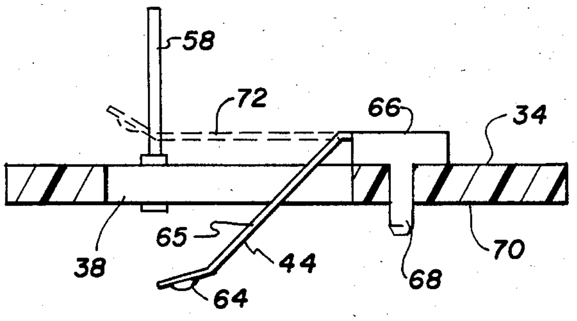
FIG. 4

AUDIO SIGNALLING DEVICE

This application is a continuation of application Ser. No. 06/430,869, filed Sept. 30, 1982, now abandoned.

BACKGROUND OF THE INVENTION

1. Field Of The Invention

The present invention generally relates to piezoelectric transducers and, in particular, to such transducers which are assembled in combination with electrical drive circuitry.

2. Statement Of The Prior Art

Piezoelectric transducers are widely used as signalling devices in a variety of different applications. Examples of such applications are computers, wrist watches, home appliances, and industrial machinery and systems. Such diversity usually means high volume production and substantial cost savings from automated manufacturing. However, the generally accepted method for manufacturing signalling devices having piezoelectric transducers usually includes the soldering of electrical leads to the transducer. This soldering step often occurs as an interruption in the manufacturing process tending to negate the advantages of automated production.

SUMMARY OF THE INVENTION

Accordingly, an audio signalling device using a piezoelectric transducer is provided which is compatible with currently known, automated, high volume production methods, the signalling device comprising: a housing having at least one end; a piezoelectric transducer; means for nodally mounting the piezoelectric transducer in proximity to the one end of the housing; a planar member; means for mounting the planar member in a spaced adjacent relationship with the piezoelectric transducer; and spring contact means located on the planar member for making spring biased electrical contact with the piezoelectric transducer.

BRIEF DESCRIPTION OF THE DRAWINGS

The present invention is illustratively described below in respect to the drawings in which:

FIG. 1. is an exploded perspective view of a signalling device constructed in accordance with one embodiment of the present invention FIG. 2 is a schematic diagram of the circuitry included in the embodiment of FIG. 1;

FIG. 3 is a perspective view of the printed circuit board included in the embodiment of FIG. 1; and FIG. 4 is a sectional view of the printed circuit board of FIG. 3 taken along view lines 4—4.

DETAILED DESCRIPTION OF THE DRAWINGS

FIG. 1 generally shows a device 10 including a housing 12 and a piezoelectric transducer 14. The housing 12 is generally cylindrical in shape having a substantially closed end 16 and an open end 18. A portion of the cylindrical wall of housing 12 between points 20 and 22 is shown sectionally removed to display the interior of the housing 12.

The closed end 16 of housing 12 includes an aperture or sound port 24 for allowing sound produced by the piezoelectric transducer 14 to escape from the housing 12. A cylindrical section 26 is located around the sound port 24 and extends from the closed end 16 of housing 12 for forming a means for nodally mounting the piezoelectric transducer 14. Cylindrical section 26 also has a portion sectionally removed between points 28 and 30 to show the interior thereof. Cylindrical section 26 extends concentrically within the cylindrical housing 12 and is thusly located beteen the piezoelectric transducer 14 and the closed end 16 forming an acoustical chamber for enhancing sound output.

The housing 12 further includes a shoulder 32 circumferentially located around the inside of the housing 12 and facing away from the closed end 16. The purpose for shoulder 32 is to support a printed circuit board 34. The printed circuit board 34 takes the form of a planar member which when mounted on the shoulder 32 is located in spaced adjacent relationship with the transducer 14. The printed circuit board 34 includes circuitry 36 and a plurality of apertures 38. Each of the apertures 38 includes a resilient electrical contact member 40, 42 and 44 extending therethrough for forming electrical contact with the transducer 14 when the board 34 is located adjacent thereto. The electrical contact member 40 forms electrical contact with the portion 46 of transducer 14. The electrical contact member 42 forms electrical contact with the portion 48 of transducer 14 and the electrical contact member 44 forms electrical contact with the portion 50 of transducer 14. Located on the other side of the printed circuit board 34 is a cover 52 which may be made by any suitable process such as injection molding of plastic and which covers electrical components located on that side of the printed circuit board 34 as shown in FIG. 3. When the printed circuit board 34 and cover 52 are assembled with the housing 12, the circuit board 34 is supported by the shoulder 32 and the cover 52 closes the open end 18 of housing 12.

FIG. 2 is a schematic diagram of the circuit included in the present invention. The piezoelectric transducer 14 is shown having electrode members 46, 48 and 50 corresponding to those in FIG. 1. The electrode 48 is a feedback electrode and is connected to the base of a transistor 54 and through a resistor 56 to the positive input terminal 58 of the signalling device. The collector of transistor 54 is also connected to the positive input terminal 58 along with the electrode 50 of transducer 14. The electrode 46 of transducer 14 and the emitter of transistor 54 are connected together and through a resistor 60 to the negative input terminal 62 of the signalling device. Thusly connected, the piezoelectric transducer 14 is energized by a voltage potential between terminals 58 and 62 applied to electrodes 50 and 46 respectively. The resulting distortion in the transducer 14 causes a signal to be generated piezoelectrically at the electrode 48 which activates the transistor 54 to allow current to flow therethrough. This causes a shorting of the voltage across electrodes 46 and 50 and causes the transducer to thereby deenergize. A further resulting signal is generated at the electrode 48 which subsequently deenergizes transistor 54 allowing the voltage potential from terminals 58 to 62 to again reach the electrodes 50 and 46, respectively. Thusly, the circuit and piezoelectric transducer 14 function in a feedback mode to cause oscillation of the transducer 14.

FIG. 3 shows the side of circuit board 34 which is not shown in FIG. 1. Apertures 38 are shown with the resilient contact members 40, 42 and 44. FIG. 3 should be viewed in conjunction with FIG. 4 which is a sectional view of the circuit board 34 taken along view lines 4—4. The electrical contact member 44 is more clearly shown in FIG. 4 to have an electrical contact point 64, a resilient contact arm 65 and a mounting member 66. Mounting member 66 includes a pair of electrical terminals 68 extending from either side of the member 66 for insertion through holes in the circuit board 34. On the circuitry side 70 of circuit board 34, the electrical terminals 68 are soldered to the printed circuitry shown in FIG. 1.

FIG. 3 further shows the remaining components of the feedback circuit, namely the transistor 54 and the resistors 56 and 60. Voltage terminals 58 and 62 are also shown in FIG. 3 and extend from circuit board 34 through the cover 52 of FIG. 1 for allowing electrical connection thereto.

The signalling device of the present invention may be easily and simply manufactured. The housing 12 including the end 16, the aperture 24, the cylindrical section 26 and the shoulder 32 may be simply and inexpensively formed by injection molding to be suitable for automated assembly and handling. The transducer 14 is typically attached to the cylindrical section 26 by resilient adhesive means. The cylindrical section 26 contacts the transducer 14 along a non-vibrating node of the transducer which minimizes damping of transducer vibrations.

The circuit board 34 may be mass produced in conveniently sized panels, containing approximately 30 to 40 such boards, by using known reinsertion or break apart techniques to minimize handling. The components including the contact members 40, 42, 44 may be automatically assembled to the circuit board 34 by commonly known techniques employing automatic component insertion equipment. The contact means are mounted on the circuit board 34 by insertion and clinching of the terminals 68 of mounting means 66 through holes in the circuit board 34. At this point in the process, the flexible resilient member 65 along with the contact point 64 located in a position 72 shown in phantom in FIG. 4, where it is on the same side of the circuit board 34 as the mounting means 66. In the position 72, neither the contact 64 nor the arm 65 can come into contact with liquid solder during automated dip soldering of the circuitry side 70 of the board 34. This prevents any contamination of the contact 64 and any loss of temper and resiliency by the resilient arm 65. Automatic insertion of the contact means 40, 42 and 44 is facilitated by the fact that each of the contact means is identical with the others and each is mounted in the same direction on the printed circuit board 34 adjacent its respective aperture or opening 38. Further, such automatic insertion is compatible with methods used for automatic component and terminal insertion.

When all of the components including resistors 56 and 60 transistor 54 and terminals 58 and 62 are mounted on the board along with the contact means 40, 42 and 44, and clinched in place, the circuit board may be dip soldered by known automatic methods to electrically connect all of the components and contact means in a simple step. Once the printed circuit board has been dip soldered and cleaned, the resilient member 65 and contact means 64 may be easily bent and located through the aperture 38 to extend past the soldered side of the printed circuit board 34 to a point where it will physically engage and make electrical contact with the transducer 14 when both the transducer 14 and the printed circuit board 34 are located within the housing 12. The bending of the resilient arm 65 may be done with automatic equipment and may be accomplished from the component side of board 34 avoiding any board reorientation.

Once the printed circuit board as shown in FIG. 3 is completed, it may be automatically assembled with the housing 12 including the transducer 14 and the cover 52. The circuit board 34 is held captive between the circumferential shoulder 32 and the cover 52. Cover 52 may be secured to the housing by any suitable means such as heat rollover of the housing edge thereagainst. This places the printed circuit board 34 in spaced adjacent relationship with the piezoelectric transducer 14 allowing the resilient contact members of contact means 40, 42 and 44 to make electrical contact with their respective sections of the transducer 14.

The embodiment of the present invention described above is intended to be taken in an illustrative sense. Various changes and modifications may be made to the described embodiment by persons skilled in the art without departing from the scope of the invention as defined in the appended claims.

What is claimed is:

1. An audio signalling device comprising:
- a housing having an open and a closed end,
- an aperture in said open end,
- a piezoelectric transducer,
- mounting means for nodally mounting said piezoelectric transducer in proximity to said closed end,
- a printed circuit board carried in said housing and spaced from said piezoelectric transducer, said printed circuit board including first and second surfaces, said first surface having electrical circuits carried thereon and said second surface facing said piezoelectric transducer and having soldered electrical connections thereon, and openings extending through said printed circuit board, and
- resilient contact means carried on said first surface and extending through said openings for engaging said piezoelectric transducer.

2. The device of claim 1, wherein said resilient contact means comprises a plurality of spring means mounted on said printed circuit with the same directional orientation.

3. The device of claim 1, wherein said piezoelectric transducer is planar and circular and said means for nodally mounting is a cylindrical section extending from said one end of said housing.

4. The device of claim 1, wherein said housing is cylindrical, further wherein said cylindrical section is affixed to said closed end around said aperture and extends concentrically with respect to and within said housing, and still further wherein said mounting means includes circumferential shoulder means located within said housing and facing away from said closed end for supporting said printed circuit board.

5. The device of claim 1, wherein said piezoelectric transducer is a three terminal feedback transducer and further wherein said resilient contact means includes three separate contacts.

6. The device of claim 1, wherein said printed circuit board further comprises a feedback circuit means mounted on said printed circuit board and connected to said resilient contact means for driving said piezoelectric transducer.

* * * * *